(12) United States Patent
Japp et al.

(10) Patent No.: US 7,329,446 B2
(45) Date of Patent: Feb. 12, 2008

(54) DRILL STACK FORMATION

(75) Inventors: Robert M. Japp, Vestal, NY (US); Gregory A. Kevern, Johnson City, NY (US); Francis S. Poch, Apalachin, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/691,882

(22) Filed: Oct. 23, 2003

(65) Prior Publication Data

US 2004/0086741 A1 May 6, 2004

Related U.S. Application Data

(62) Division of application No. 09/788,081, filed on Feb. 16, 2001, now Pat. No. 6,669,805.

(51) Int. Cl.
*B32B 38/04* (2006.01)
*B32B 9/00* (2006.01)
*B32B 3/10* (2006.01)
*B32B 15/04* (2006.01)

(52) U.S. Cl. .................... 428/40.1; 428/131; 428/343; 428/344; 428/42.3; 408/1 R; 156/253

(58) Field of Classification Search ............... 428/131, 428/40.1, 343, 344, 355 RA, 137, 42.3; 83/29; 156/253; 408/1 R
See application file for complete search history.

(56) References Cited

U.S. PATENT DOCUMENTS

| 3,464,883 | A | * | 9/1969 | Strand et al. ............. 428/42.2 |
| 4,269,549 | A | * | 5/1981 | Block ..................... 408/1 R |
| 4,311,419 | A | * | 1/1982 | Block ..................... 408/1 R |
| 4,696,711 | A |   | 9/1987 | Greszczuk |
| 4,734,155 | A |   | 3/1988 | Tsunoda et al. |
| 4,781,495 | A | * | 11/1988 | Hatch et al. ............... 408/1 R |
| 4,929,370 | A | * | 5/1990 | Hatch et al. ............... 508/100 |

(Continued)

FOREIGN PATENT DOCUMENTS

JP    59051597    3/1984

(Continued)

OTHER PUBLICATIONS

Richard L. Abrahams; *EDN vol. 47 No. 23 Oct. 17, 2002*; Reed Business Information 2002; pp. 69 (3).

(Continued)

*Primary Examiner*—Patricia L. Nordmeyer
(74) *Attorney, Agent, or Firm*—Schmeiser, Olsen & Watts; William H. Steinberg (57) ABSTRACT

The present invention provides a structure. The structure includes a stack of sheets. Successive sheets in each pair of successive sheets of the stack are coupled to each other by a removable adhesive. The removable adhesive is also disposed on top and bottom surfaces of the stack so as to respectively couple first and second layers to the cop and bottom surfaces of the stack.

22 Claims, 6 Drawing Sheets

U.S. PATENT DOCUMENTS

| | | | |
|---|---|---|---|
| 5,019,946 A | | 5/1991 | Eichelberger et al. |
| 5,083,888 A | | 1/1992 | Gapp et al. |
| 5,107,586 A | | 4/1992 | Eichelberger et al. |
| 5,227,606 A | * | 7/1993 | Weeks et al. ........... 219/121.67 |
| 5,228,373 A | | 7/1993 | Welsch |
| 5,435,671 A | * | 7/1995 | Weinreich ................... 408/1 R |
| 5,480,269 A | * | 1/1996 | Ejiri et al. .................. 408/1 R |
| 5,507,603 A | * | 4/1996 | Nakano et al. ............. 408/1 R |
| 5,538,579 A | | 7/1996 | Ishimura et al. |
| 5,730,824 A | | 3/1998 | Spence et al. |
| 5,834,582 A | * | 11/1998 | Sinclair et al. ............. 528/354 |
| 5,961,255 A | * | 10/1999 | Korbonski ................... 408/1 R |
| 6,000,886 A | * | 12/1999 | Washio et al. .............. 408/1 R |
| 6,200,074 B1 | * | 3/2001 | Miller et al. ................ 408/1 R |
| 6,355,360 B1 | * | 3/2002 | Frater ......................... 428/607 |
| 6,363,599 B1 | | 4/2002 | Bajorek |

FOREIGN PATENT DOCUMENTS

| | | |
|---|---|---|
| JP | 94145608 | 6/1994 |

OTHER PUBLICATIONS

Michael Moeller; "Newton-based apps to include spreadsheets; LAN E-mail clients"; *PC Week*, 1994; pp. 45 & 47.

Sung Park et al.; "Simulating Networks of Wireless Sensors"; *Proceedings of the 2001 Winter Simulation Conference*; pp. 1330-1338.

Ashutosh Dutta et al.; "Realization of Integrated Mobility Management Protocol for Ad-Hoc Networks"; *IEEE 2002*; pp. 448-454.

Csego Orosz et al.; "Radio Access Optimisation for Point-Multipoint Systems Based on Homogeneous Simulated Annealing"; *IEEE 2002*; pp. 2214-2217.

* cited by examiner

DRILL STACK FORMATION

This application is a divisional of Ser. No. 09/788,081; filed on Feb. 16, 2001, now U.S. Pat. No. 6,669,805 B2.

BACKGROUND OF THE INVENTION

1. Technical Field

The present invention relates to a method of temporarily adhering a stack of sheets together to facilitate drilling a hole through the stack of sheets.

2. Related Art

A stack of sheets may be adhered together around a periphery of each sheet using an adhesive such as a glass cloth impregnated with epoxy. Hole burring occurs as a drill passes through the stack. Additionally, each sheet separates from an adjacent sheet as the drill passes between the sheets. This results in the whole stack of sheets expanding. An alternate method includes the permanent application of cured epoxy over the entire surface of each sheet in the stack. The thickness of the epoxy between each sheet results in excessive thickness of the overall stack as well as composites which will contain the separated sheets when they are processed into composites. A method of drilling a stack of sheets that overcomes these problems plus others is desired.

SUMMARY OF THE INVENTION

A first general aspect of the present invention provides a structure comprising:

a stack comprising a plurality of sheets such that each successive sheet is coupled with a removable adhesive between each sheet; and an opening extending through the plurality of sheets within the stack.

A second general aspect of the present invention provides a structure comprising:

a plurality of stacks wherein each successive stack is coupled with a removable adhesive to an intermediate layer between each stack wherein each intermediate layer prevents burr formation; and wherein each stack comprises a plurality of sheets such that each successive sheet is coupled with a removable adhesive between each sheet.

A third general aspect of the present invention provides a method comprising:

forming a stack by stacking a plurality of sheets;

applying an adhesive between each successive sheet;

applying a vacuum to the plurality of sheets;

heating the plurality of sheets to melt the solid adhesive;

applying a first pressure to the sheets;

cooling the plurality of sheets; and forming an opening through the plurality of sheets; and separating the sheets.

A fourth general aspect of the present invention provides a method comprising:

forming a stack by stacking a plurality of sheets;

applying a thin layer of water between each successive sheet;

applying a pressure to the sheets; and forming an opening through the plurality of sheets.

BRIEF DESCRIPTION OF THE DRAWINGS

For an understanding of the present invention, reference should be made to the following detailed description taken in connection with the accompanying drawings wherein.

DETAILED DESCRIPTION OF THE INVENTION

Figure 1:
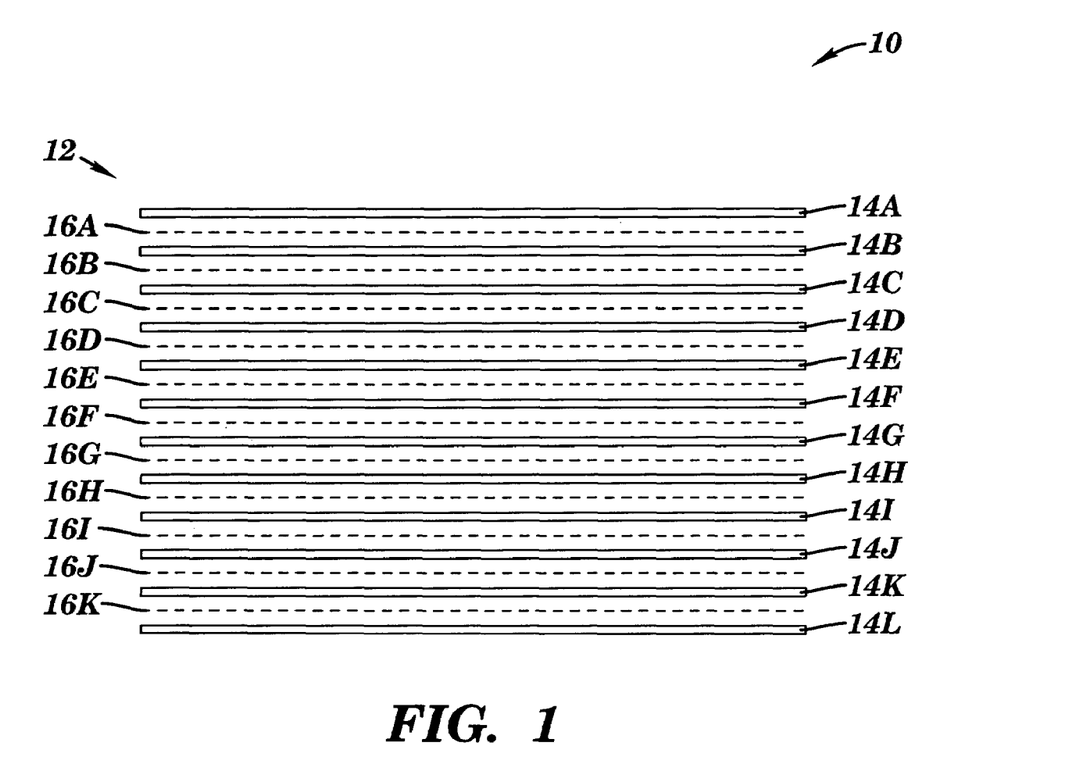
FIG. 1 illustrates a first embodiment of the present invention including a side view of a laminated structure including a stack comprising a plurality of sheets including a removable adhesive between each sheet.

FIG. 1 illustrates a schematic view of a laminated structure 10 including a stack 12 in accordance with a first embodiment. The stack 12 includes a plurality of sheets 14A-14L. A removable adhesive 16A-16K is applied between each sheet 14A-14L, respectively. The sheets 14A-14L may comprise any suitable material (e.g., copper, invar, copper-invar-copper, etc.). Invar is an iron-nickel alloy. The removable adhesive 16A-16K may comprise any suitable material (e.g., fructose, sucrose, water soluble polymers, water, etc.). The material may comprise any suitable form (e.g., powered fructose, a liquid, a liquid solution, etc.).

Figure 2:
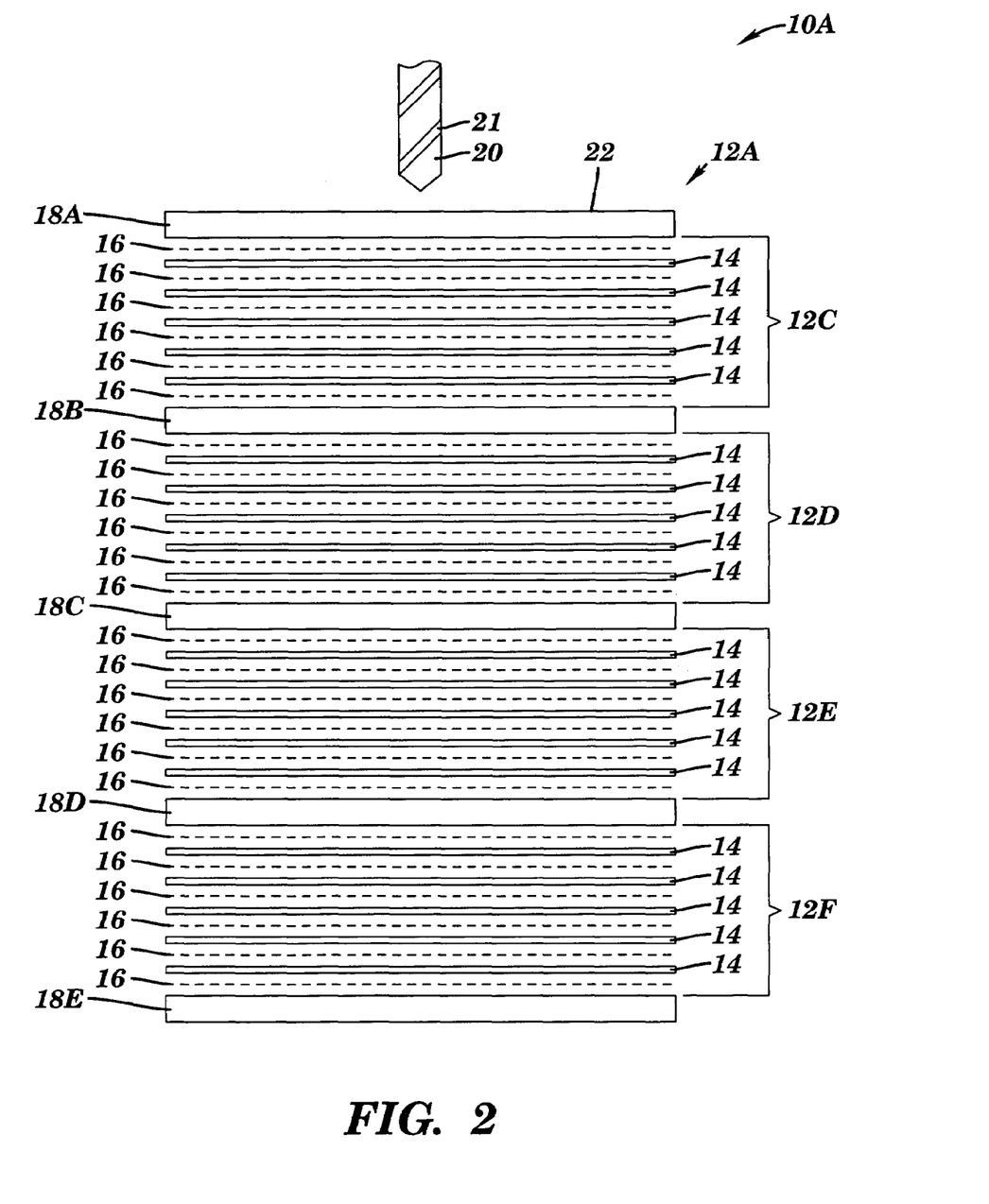
FIG. 2 illustrates a second embodiment of the present invention including a side view of a laminated structure including a plurality of stacks including a plurality of layers separating each stack.

FIG. 2 illustrates a laminated structure 10A including a stack 12A in accordance with a second embodiment. The stack 12A includes a plurality of stacks 12C, 12D, 12E, and 12F interspersed with a plurality of layers 18A-18E. Each stack 12C, 12D, 12E and 12F includes a plurality of sheets 14 with removable adhesive placed between each sheet 14. Also, the removable adhesive 16 is placed between each layer 18A-18E and each adjacent sheet 14. Each layer 18B and 18C prevents chip build up within drill bit flutes 21 by providing an interruption in the sheet 14 being drilled. Each layer 18A-18E comprises any suitable soft material (e.g., impregnated and laminated epoxy/glass, phenolic/paper laminate, aluminum, etc.). The formation chips are broken off each time the drill bit 20 passes from one material to a dissimilar material. For example, if each sheet 14 is copper, and each layer 18A-18E is (aluminum or paper/phenolic), then any tendency for chip build up would be interrupted each time the drill bit 20 passes from copper to (aluminum or paper/phenolic), or from (aluminum or paper/phenolic) to copper. Additionally, the first layer 18A keeps the drill bit from wandering as it enters the stack 12A of the laminated structure 10A. A soft material, such as aluminum, assists the drill bit 20 in starting a hole 102 at a desired location without wandering about a top surface 22 of the layer 18A.

Figure 3:
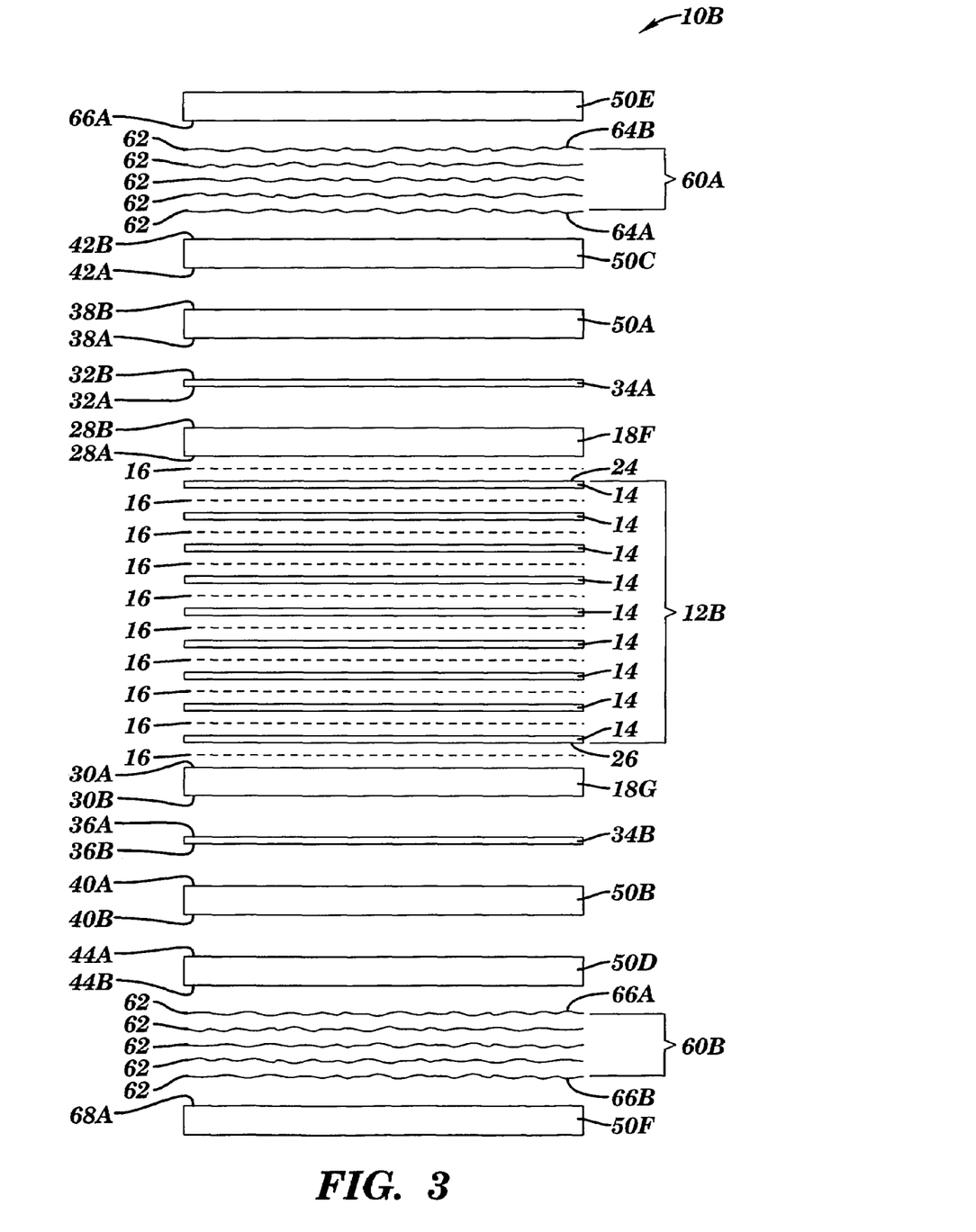
FIG. 3 illustrates a third embodiment of the present invention including an exploded side view of another embodiment of a laminated structure including a plurality of blotter sheets and a plurality plates added to a stack.

FIG. 3 illustrates a laminated structure 10B including a stack 12B in accordance with a third embodiment. The stack 12B includes a plurality of sheets 14. The removable adhesive 16 is applied between each sheet 14. The stack 12B includes a first surface 24 and a second surface 26. A first surface 28A of a first layer 18F is coupled with the removable adhesive 16 to the first surface 24 of the stack 12B. A first surface 30A of a second layer 18G is coupled with the removable adhesive 16 to the second surface 26 of the stack 12B. A first surface 32A of a first foil 34A contacts a second surface 28B of the first layer 18F. A first surface 36A of a second foil 34B contacts a second surface 30B of the second layer 18G.

A first surface 38A of a first plate 50A contacts a second surface 32B of the first foil 34A. A first surface 40A of a second plate 50B contacts a second surface 36B of the second foil 34B. A first surface 42A of a third plate 50C contacts a second surface 38B of the first plate 50A. A first surface 44A of a fourth plate 50D contacts a second surface 40B of the second plate 50B. The plates 50A-50D may include any suitable material, such as stainless steel.

The laminated structure 10B includes a first blotter pad 60A and a second blotter pad 60B. The first blotter pad 60A includes at least one blotter sheet 62, and the second blotter pad 60B includes at least one blotter sheet 62. The blotter sheets 62 may include any suitable compressible material, such as paper. The blotter pads 60A and 60B absorb any misalignment between a pair of pressure surfaces 90A and 90B (FIG. 4) and the stack 12B, so that a uniform pressure is applied to the stack 12B.

A first surface 64A of the first blotter pad 60A contacts a second surface 42B of the third plate 50C. A first surface 66A of the second blotter pad 60B contacts a second surface 44B of the fourth plate 50D. A second surface 64B of the first blotter pad 60A contacts a first surface 66A of a fifth plate 50E. A second surface 66B of the second blotter pad 60B contacts a first surface 68A of a sixth plate 50F. The plates 50E and 50F may include any suitable material, such as stainless steel.

Figure 4:
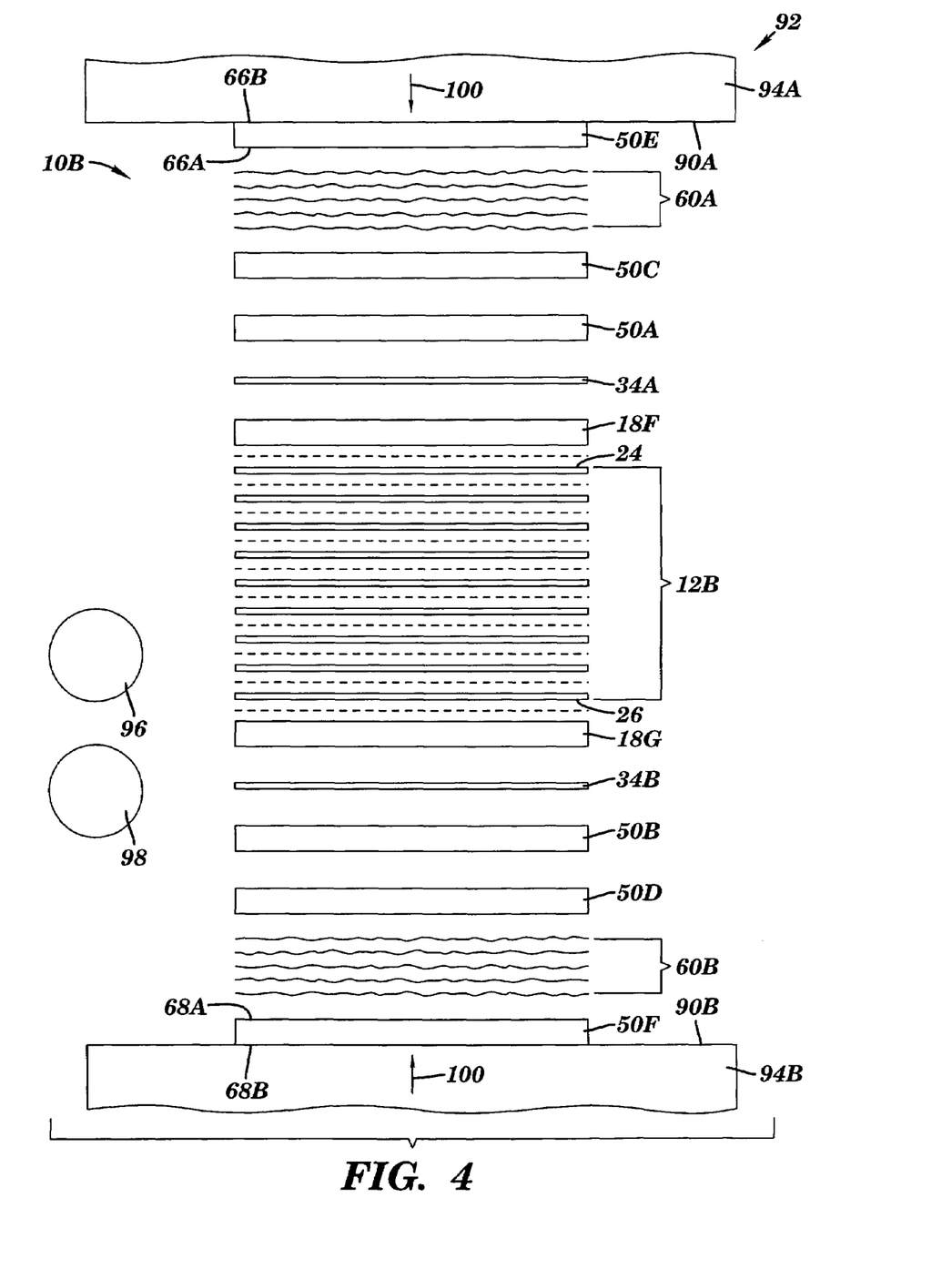
FIG. 4 illustrates the laminated structure of FIG. 3 positioned within a press apparatus for forming a rigid stack.

FIG. 4 illustrates the laminated structure 10B of FIG. 3 positioned within a press apparatus 92. The press apparatus 92 includes a first pressure head 94A, a second pressure head 94B, a vacuum source 96, and a heat source 98. The first pressure head 94A and the second pressure head 94B provide a compressive force 100 to the laminated structure 10B. A second surface 66B of the fifth plate 50E contacts the pressure surface 90A of the first pressure head 94A. A second surface 68B of the sixth plate 50F contacts the pressure surface 90B of the second pressure head 94B.

Figure 5:
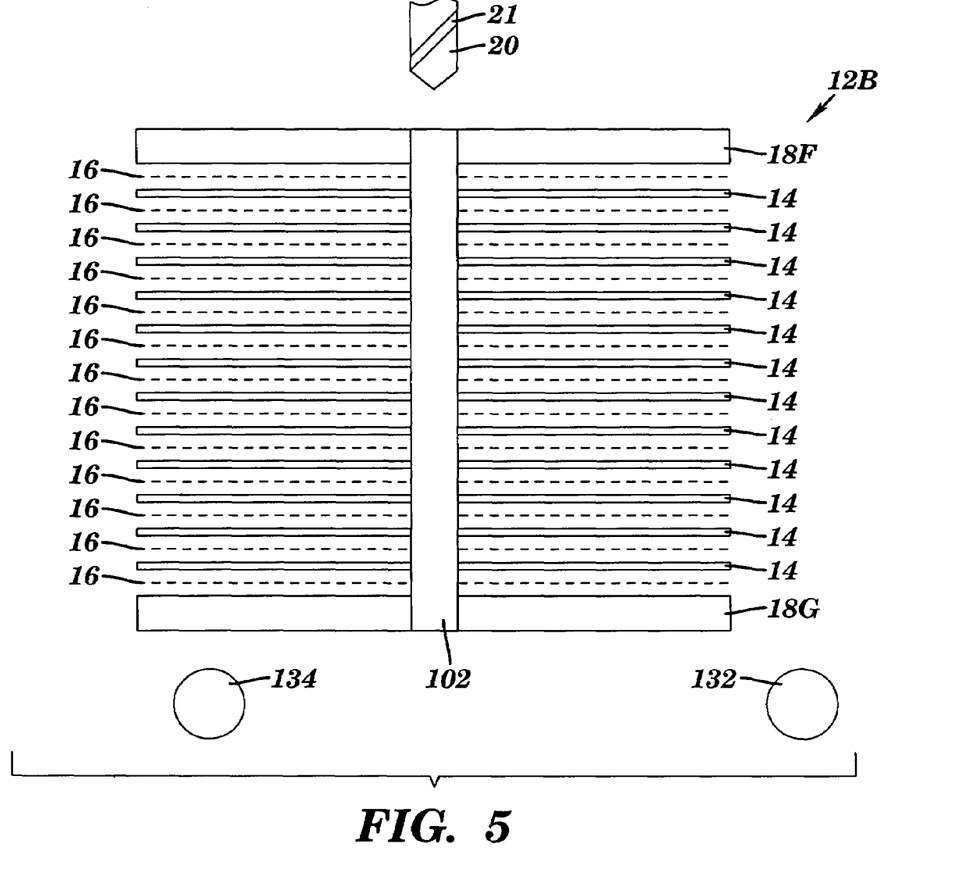
FIG. 5 illustrates the rigid stack of FIG. 4 with a burr free hole drilled through each sheet of the stack.
Figure 6:
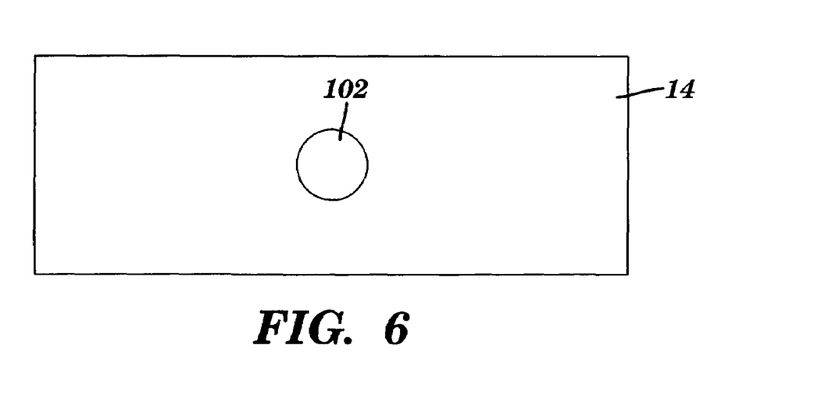
FIG. 6 illustrates a plan view of a hole within a sheet of the stack.
Figure 7:
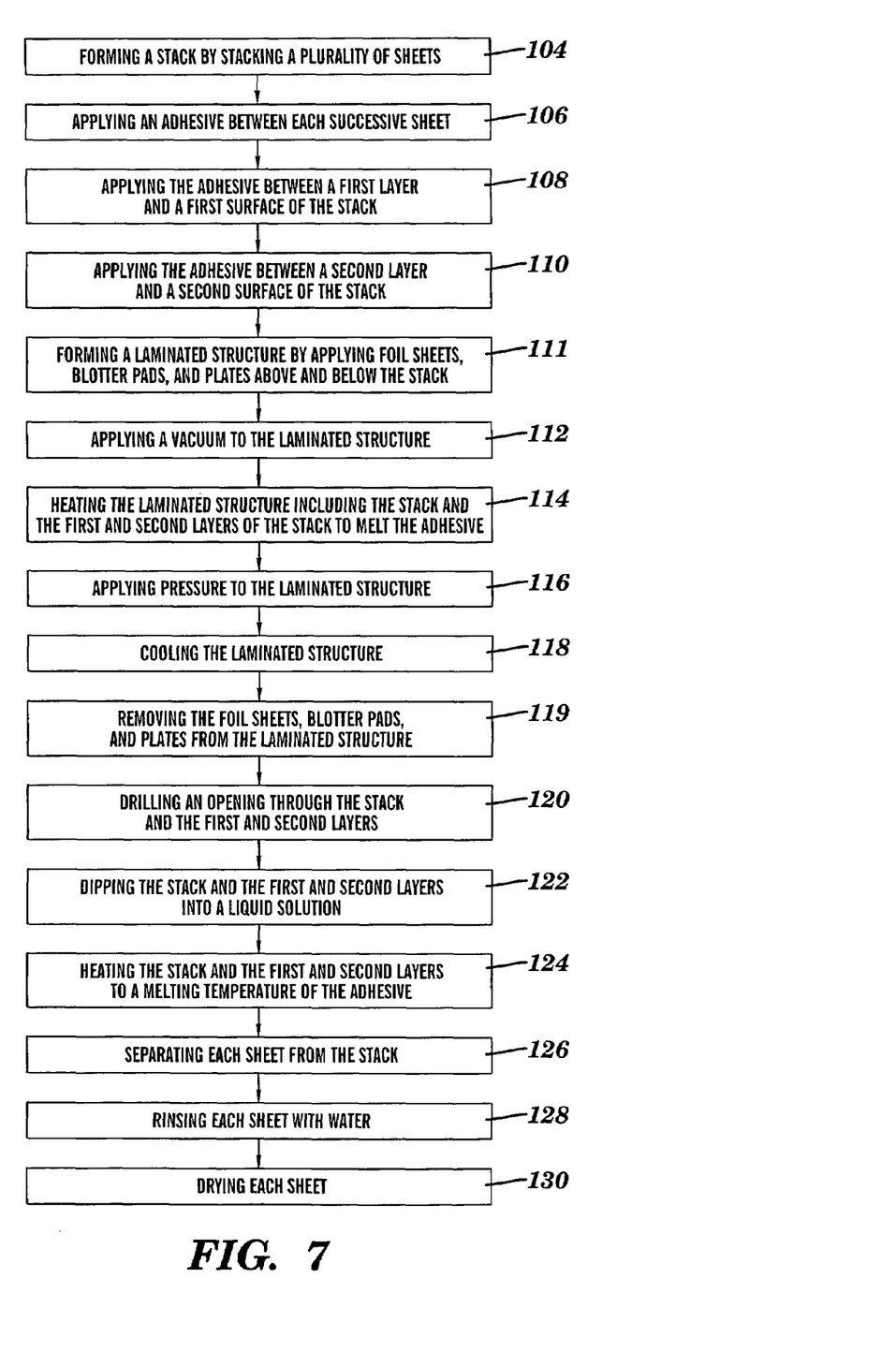
FIG. 7 illustrates a flow chart of a method for producing a burr free hole in each sheet of the stack.

FIG. 7 illustrates a flow chart of a method for producing a burr free hole 102 in each sheet 14 of the stack 12B (FIGS. 5 and 6). Step 104 includes stacking a plurality of sheets 14 to form the stack 12B. Step 106 includes applying a removable adhesive 16 between each successive sheet 14 in the stack 12B. Step 108 includes applying the removable adhesive 16 between the first layer 18F and the first surface 24 of the stack 12B. As mentioned above, the removable adhesive 16 may comprise any suitable material (e.g., fructose, sucrose, water soluble polymers, water, water solutions, etc.). The following example describes using the removable adhesive 16 in the form of solid powered fructose. Step 110 includes applying the removable adhesive 16 between the second layer 18G and the second surface 26 of the stack 12B. Step 111 includes forming the laminated structure 10B by applying the foil sheets 34A, 34B the 50A-50F, and the blotter pads 60A and 60B to the stack 12B, as illustrated in FIG. 7. Step 112 includes applying a vacuum to the laminated structure 10B using the vacuum source 96. Step 114 includes heating the laminated structure 10B to melt the removable adhesive 16.

Step 116 includes applying the compressive force 100 to the laminated structure 10B. For fructose, the heat source 98 provides a temperature of about 50° C. to 200° C. and a first compressive force 100 applied to the laminated structure 10B creates a pressure of about 25 to 75 psig. After about 10 to 20 minutes, the fructose particles start to soften, and the pressure is increased to about 200 to 400 psig. The increase in pressure is delayed to ensure that every fructose particle has been softened to prevent denting of the sheets 14. The pressure and temperature are held for about 5 to 15 minutes and then shut off and the laminated structure 10B is cooled while maintaining pressure. When the stack is cool, the pressure is removed and the laminated structure 10B is removed from the press apparatus 92.

In step 118, the laminated structure 10B is cooled to an ambient temperature. In step 119, the foil sheets 34A, 34B, the blotter pads 60A, 60B, and the plates 50A-50F are removed from the laminated structure, and the stack 12B and the attached layers 18F and 18G are removed from the press apparatus 92. In step 120, a drill bit 20 drills the hole 102 through the stack 12B and the layers 18F and 18G, as illustrated in FIG. 5. In step 122, the stack 12B and the layers 18F and 18G are dipped into a liquid solution 132 to dissolve the fructose. For fructose, the liquid solution 132 may include an ethylene glycol/water mixture. In step 124 the removable adhesive is heated in the liquid solution 132 temperature of about 130° C. to about 150° C. for about 5 minutes to melt the removable adhesive 16. In step 126, the sheets 14 are separated from each other using any suitable device, such as tweezers, clamping devices, etc. In step 128, each sheet 14 is rinsed with any suitable liquid, such as, distilled water and/or a mild detergent solution. In step 130 each sheet 14 is dried using a gas, such as hot dry air. Alternatively, the sheets 14 may be separated by placing the stack 12B in a steam autoclave 134. In the steam autoclave 134, pressurized steam is driven between each sheet 14. The sheets 14 are then separated, rinsed in water and dried. FIG. 6 illustrates a plan view of the sheet 14 having formed a burr free hole 102.

While embodiments of the present invention have been described herein for purposes of illustration, many modifications and changes will become apparent to those skilled in the art. For example, the removable adhesive 16A-16K may comprise a thin layer of water. The surface tension of the thin layer of water between each sheet 14A-14L of the laminated structure 10A holds the laminated structure 10A together while the hole 102 is drilled. Each sheet 14A-14L is peeled off the laminated structure 10A and rinsed in additional water to remove any material particles. Then, each sheet 14A-14L is dried. Accordingly, the appended claims are intended to encompass all such modifications and changes as fall within the true spirit and scope of this invention.

We claim:

1. A structure, comprising:
    a stack of two or more sheets, wherein successive sheets in each pair of successive sheets of the stack are adhesively coupled to each other by an adhesive layer consisting of a removable adhesive, wherein the adhesive layer is in direct mechanical contact with the successive sheets in each pair, and wherein the removable adhesive is also disposed on top and bottom surfaces of the stack, and wherein the removable adhesive consists of a liquid while adhesively coupling the successive sheets to each other;
    a first surface of a first layer coupled with the removable adhesive to a first surface of the stack; and a first surface of a second layer coupled with the removable adhesive to a second surface of the stack, wherein the first and second layers are adapted to prevent burr formation in a hole subsequently drilled through the stack.

2. The structure of claim 1, wherein the sheets each consist of a material selected from the group consisting of copper, invar, copper-invar-copper, aluminum, and molybdenum.

3. The structure of claim 1, wherein the removable adhesive consists of a material selected from the group consisting of fructose, sucrose, water, and a water solution.

4. The structure of claim 1, wherein the removable adhesive consists of a material selected from the group consisting of fructose and sucrose.

5. The structure of claim 1, wherein a continuous opening extends through the stack, the first layer, and the second layer.

6. The structure of claim 1, further including:
a first surface of a first foil layer contacting a second surface of the first layer, wherein the first foil layer consists of a first foil; and
a first surface of a second foil layer contacting a second surface of the second layer, wherein the second foil layer consists of a second foil.

7. The structure of claim 6, wherein the first and second layer comprises a material selected from the group consisting of impregnated and laminated epoxy/glass, phenolic/paper laminate, and aluminum.

8. The structure of claim 6, further including:
a first surface of a first plate contacting a second surface of the first foil; and
a first surface of a second plate contacting a second surface of the second foil.

9. The structure of claim 8, wherein the first and second foil comprises copper.

10. The structure of claim 8, further including:
a first surface of a third plate contacting a second surface of the first plate; and
a first surface of the fourth plate contacting a second surface of the second plate.

11. The structure of claim 10, further including:
a first blotter pad comprising at least one blotter sheet;
a first surface of the first blotter pad contacting a second surface of the third plate;
a second blotter pad comprising at least one blotter sheet; and
a first surface of the second blotter pad contacting a second surface of the fourth plate.

12. The structure of claim 11 wherein the first and second blotter sheet comprises paper.

13. The structure of claim 11, further including:
a first surface of a fifth plate contacting a second surface of the first blotter pad; and
a first surface of a sixth plate contacting a second surface of the second blotter pad.

14. The structure of claim 13, wherein the fifth and sixth plate comprises stainless steel.

15. The structure of claim 13, further including:
a first pressure head contacting a second surface of the fifth plate; and
a second pressure head contacting a second surface of the sixth plate.

16. The structure of claim 15, wherein a compressive force is acting upon the stack, the first layer, the second layer, the first foil, the second foil, the first plate, the second plate, the third plate, the fourth plate, the first blodder pad, the second blodder pad, the fifth plate, and the sixth plate, and wherein the compressive force is being provided by the first and second pressure heads.

17. The structure of claim 16, wherein the stack, the first layer, the second layer, the first foil, the second foil, the first plate, the second plate, the third plate, the fourth plate, the first blodder pad, the second blodder pad, the fifth plate, and the sixth plate are at an elevated temperature.

18. The structure of claim 17, wherein the elevated temperature is in a range of 50° F. to 200° F.

19. A structure, comprising:
a plurality of stacks, wherein each stack and its adjacent stack of the plurality of stacks are both coupled with a removable adhesive to an intermediate layer therebetween, wherein each intermediate layer is adapted to prevent burr formation in a hole subsequently drilled through the stack, wherein each stack comprises a plurality of sheets such that each sheet and its adjacent sheet of the plurality of sheets are adhesively coupled to each other with an adhesive layer consisting of the removable adhesive, wherein the adhesive layer is in direct mechanical contact with said each sheet and its adjacent sheet, and wherein the removable adhesive consists of a liquid while adhesively coupling said each sheet with its adjacent sheet.

20. The structure of claim 19, wherein the sheets each consist of a material selected from the group consisting of copper, invar, copper-invar-copper, aluminum, and molybdenum.

21. The structure of claim 19, wherein the removable adhesive, while adhesively coupling said each sheet with its adjacent sheet, consists of a material selected from the group consisting of water and a water solution.

22. The structure of claim 19, wherein the removable adhesive, while adhesively coupling said each sheet with its adjacent sheet, consists of a material selected from the group consisting of fructose and sucrose.

* * * * *